United States Patent
Zhang et al.

(10) Patent No.: US 12,062,596 B2
(45) Date of Patent: Aug. 13, 2024

(54) SEMICONDUCTOR DIE WITH STEPPED SIDE SURFACE

(71) Applicant: TEXAS INSTRUMENTS INCORPORATED, Dallas, TX (US)

(72) Inventors: Rongwei Zhang, Plano, TX (US); Chien Hao Wang, Taipei (TW); Bob Lee, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/373,958

(22) Filed: Jul. 13, 2021

(65) Prior Publication Data

US 2023/0017286 A1 Jan. 19, 2023

(51) Int. Cl.
| | |
|---|---|
| *H01L 23/495* | (2006.01) |
| *H01L 21/48* | (2006.01) |
| *H01L 21/56* | (2006.01) |
| *H01L 21/78* | (2006.01) |
| *H01L 23/00* | (2006.01) |
| *H01L 23/31* | (2006.01) |

(52) U.S. Cl.
CPC .... *H01L 23/49513* (2013.01); *H01L 21/4821* (2013.01); *H01L 21/565* (2013.01); *H01L 21/78* (2013.01); *H01L 23/3107* (2013.01); *H01L 24/48* (2013.01); *H01L 2224/48245* (2013.01); *H01L 2924/182* (2013.01)

(58) Field of Classification Search
CPC .......... H01L 23/49513; H01L 21/4821; H01L 21/565; H01L 23/3107; H01L 24/48; H01L 2224/48245; H01L 2924/182

USPC .......................................................... 257/676
See application file for complete search history.

(56) References Cited

U.S. PATENT DOCUMENTS

| | | |
|---|---|---|
| 6,890,836 B2 | 5/2005 | Howard et al. |
| 10,083,896 B1 | 9/2018 | Zhang et al. |
| 10,366,944 B2 | 7/2019 | Zhang et al. |
| 10,535,588 B2 * | 1/2020 | Rodriguez ............... H01L 24/29 |
| 10,784,188 B2 | 9/2020 | Zhang et al. |
| 2011/0193200 A1 | 8/2011 | Lyne et al. |
| 2013/0127029 A1 | 5/2013 | Lee et al. |
| 2013/0154117 A1 * | 6/2013 | Tan ..................... H01L 29/0657 438/109 |
| 2018/0166420 A1 * | 6/2018 | Park .................... H01L 25/0657 |
| 2019/0074431 A1 * | 3/2019 | Hasegawa ........... H01L 21/6835 |
| 2020/0051860 A1 | 2/2020 | Wyant et al. |
| 2020/0273813 A1 * | 8/2020 | Daryl Wee ............ H01L 23/562 |
| 2021/0193590 A1 | 6/2021 | Wang et al. |

* cited by examiner

*Primary Examiner* — Bo B Jang
*Assistant Examiner* — Dilinh P Nguyen
(74) *Attorney, Agent, or Firm* — Ronald O. Neerings; Frank D. Cimino (57) ABSTRACT

A semiconductor device includes a substrate and a semiconductor die including an active surface with bond pads, an opposite inactive surface, and stepped side surfaces extending between the active surface and the inactive surface. The stepped side surfaces include a first planar surface extending from the inactive surface towards the active surface, a second planar surface extending from the active surface towards the inactive surface, and a side surface offset between the first planar surface and the second planar surface. The semiconductor device further includes an adhesive layer covering at least a portion of a surface area of the second surface and attaching the semiconductor die to the substrate.

22 Claims, 7 Drawing Sheets

SEMICONDUCTOR DIE WITH STEPPED SIDE SURFACE

TECHNICAL FIELD

This disclosure relates to semiconductor packages.

BACKGROUND

Electronic package technology continues trends towards miniaturization, integration, and speed. Semiconductor packages provide support for an integrated circuit (IC) chip or semiconductor die and associated bond wires, provide protection from the environment, and enable surface-mounting of the die to and interconnection with an external component, such as a printed circuit board (PCB). Leadframe semiconductor packages are well known and widely used in the electronics industry to house, mount, and interconnect a variety of ICs.

A conventional leadframe is typically die-stamped from a sheet of flat-stock metal and includes a plurality of metal leads temporarily held together in a planar arrangement about a central region during package manufacture by siderails forming a rectangular frame. A die pad for a semiconductor die is supported in the central region by "tie-bars" that attach to the frame. The leads extend from a first end integral with the frame to an opposite second end adjacent to, but spaced apart from, the die pad.

The die pad serves as a substrate providing a stable support for firmly positioning the semiconductor die within the semiconductor package during manufacturing, whereas the leads provide electrical connections from outside the package to the active surface of the semiconductor die. Gaps between the inner end of the leads and contact pads on the active surface of the semiconductor die are bridged by connectors, typically wire bonds-thin metal wires individually bonded to both the contact pads and the leads.

Semiconductor packages may further include a mold compound covering the pad, the semiconductor die, wire bonds, and portions of the leads. Such semiconductor packages may be created by a molding process, with a polymer compound, such as an epoxy formulation filled with inorganic granules, molded around an assembled semiconductor die and leadframe portions. In this process, a leadframe with the attached and bonded semiconductor die is placed in the cavity of a steel mold. Viscous mold compound is pressured into the cavity to fill the cavity and surround the semiconductor die and leadframe portions without voids. After polymerizing the compound, for example, by cooling to ambient temperature, the mold is opened, while the mold compound remains adhered to the molded parts.

BRIEF SUMMARY

Packages disclosed herein include semiconductor dies with stepped sides which control fillet height of die attach paste. Such techniques may improve control of flow and placement of die attach paste used to mount semiconductor dies to a die pad, thereby mitigating package failures by preventing die attach paste from flowing onto die top surface, which can cause die top delamination and electrical failure since electrically conductive die attach paste may bridge two adjacent wires.

In one example, a semiconductor device includes a substrate and a semiconductor die including an active surface with bond pads, an opposite inactive surface, and stepped side surfaces extending between the active surface and the inactive surface. The stepped side surfaces include a first planar surface extending from the inactive surface towards the active surface, a second planar surface extending from the active surface towards the inactive surface, and a side surface offset between the first planar surface and the second planar surface. The semiconductor device further includes an adhesive layer covering at least a portion of a surface area of the second surface and attaching the semiconductor die to the substrate.

In another example, a semiconductor die includes an active surface with bond pads, an opposite inactive surface, and stepped side surfaces extending between the active surface and the inactive surface. The stepped side surfaces include a first planar surface extending from the inactive surface towards the active surface, a second planar surface extending from the active surface towards the inactive surface, and a side surface offset between the first planar surface and the second planar surface.

In a further example, a method for forming a semiconductor device includes forming grooves in a semiconductor wafer comprising a plurality of semiconductor dies between adjacent semiconductor dies, wherein the semiconductor wafer remains intact subsequent to forming the grooves, and cutting the semiconductor wafer along the grooves to singulate the adjacent semiconductor dies. Each of the singulated semiconductor dies include an active surface with bond pads, an opposite inactive surface, and stepped side surfaces extending between the active surface and the inactive surface. The stepped side surfaces include a first planar surface extending from the inactive surface towards the active surface, a second planar surface extending from the active surface towards the inactive surface, and a side surface offset between the first planar surface and the second planar surface.

DETAILED DESCRIPTION

The reliability of the adhesion between the mold compound and the covered parts of a semiconductor package depends on the integrity in time and temperature of the interfaces between the mold compound and the parts, as well as the ability to handle mechanical stresses during manufacture and operation. Mechanical interlocking of mold compound and parts may handle physical expansions and contractions based on different coefficients of thermal expansion to prevent delamination.

Bonding between a die pad and semiconductor die is a critical aspect of the semiconductor package. To ensure proper bonding, a die attach material, such as a die attach paste or die attach film should cover the entire surface area of the bottom of the semiconductor die.

Ensuring interlocking between the semiconductor die and mold compound requires certain portions of the semiconductor die to remain uncovered by die attach material. The die attach paste should not spread too far up the sides of the semiconductor die, referred to as the fillet height, as exposed side surfaces are needed to mitigate risk of delamination between the semiconductor die and the mold compound of a semiconductor packages. In addition, no die attach paste should reach the top surface of the semiconductor die, as it may interfere with wire bonding and/or cause shorting between adjacent die terminals. Accordingly, controlling the flow of die attach adhesive to limit fillet height may mitigate delamination and thus improve the robustness and reliability of semiconductor packages.

As semiconductor dies become ever thinner, controlling the fillet height of die attach paste while maintaining full coverage of the bottom surface of a semiconductor die becomes more difficult. Die attach film alleviates this difficulty, but die attach film is generally more expensive to manufacture than die attach paste. In addition, die attach pastes may include higher proportions of metallic fillers (such as silver particles) and provide better thermal conductivity between the semiconductor die and die pad compared to die attach films. Die attach paste can wet better on leadframe surface than die attach film (solid), and thus having a better adhesion and better delamination performance. For larger dies, such as greater than 5 mm by 5 mm, die attach films do not wet the leadframe well during die bond and delamination can occur even after die bond. For this reason, die attach pastes remains an important option for attaching semiconductor dies to substrates in semiconductor packages.

Semiconductor packages disclosed herein include semiconductor dies with stepped side surfaces. The stepped sides restrict flow of the die attach material and control fillet height to limit coverage of the stepped side surfaces. In some examples, the stepped side surfaces may be implemented with a two-part cut of a semiconductor die: a partial-thickness cut that removes a width of material from the street separating two semiconductor dies within a semiconductor wafer and another cut that removes less material, such as minimal material or no material from the reminder of the thickness of the wafer along the street. One example technique is stealth laser dicing and cool expansion. Stealth dicing is a process that focuses a laser inside the silicon wafer to create a cleaving start point and external pressure then applied to the wafer to separate it into multiple dies using a tape expander under cool conditions (typically minus 15 to 0 degrees Celcius). Example techniques for manufacturing a semiconductor die with stepped side surfaces are shown and described with respect to FIGS. 1A-1E.

Figure 1A:
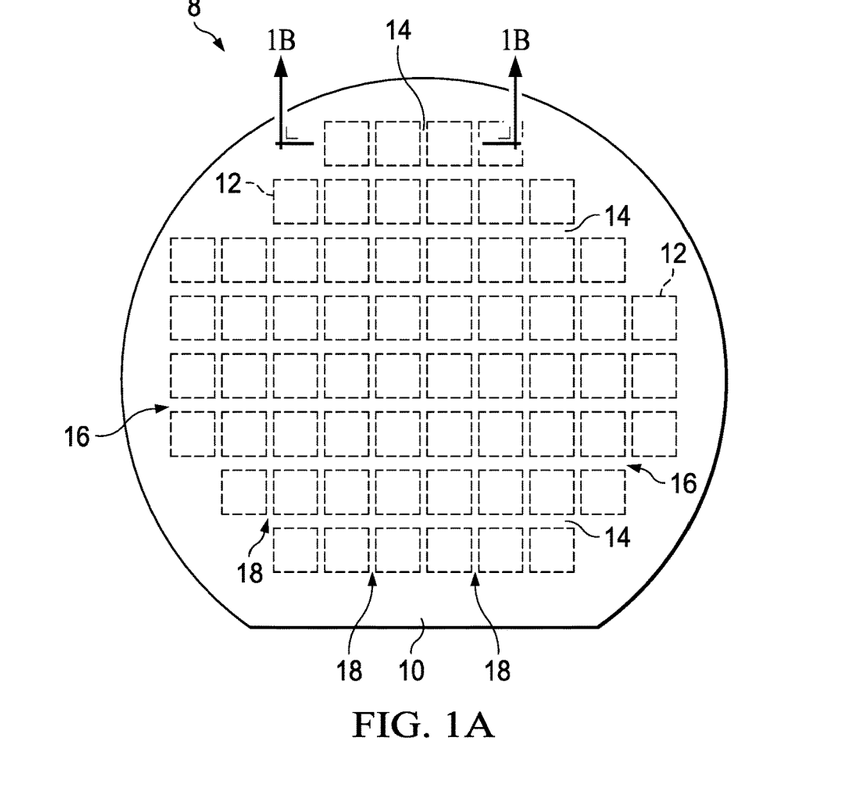
FIGS. 1A-1E illustrate conceptual process steps for manufacturing a semiconductor die with stepped side surfaces.

FIGS. 1A-1E illustrate conceptual process steps for singulating a plurality of semiconductor dies 120 from a semiconductor wafer 8. FIG. 1A depicts a semiconductor wafer 8 including a semiconductor substrate 10 and a plurality of interconnected semiconductor dies 12 that have been formed on and within the semiconductor substrate 10 using known techniques. Wafer 8 further includes a plurality of spaces 14 arranged in rows 16 and columns 18 which separate each die 12 from an adjacent die 12.

Figure 1B:
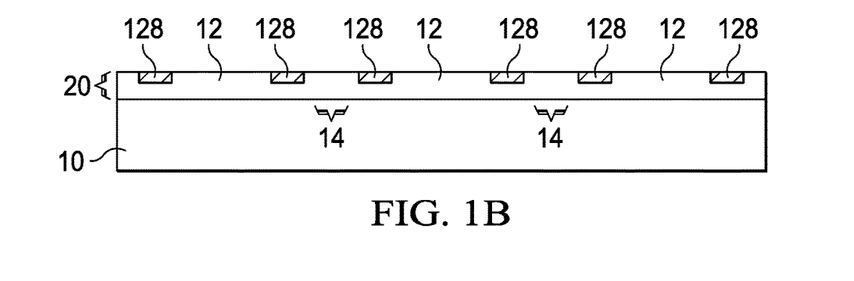

FIG. 1B depicts a magnified view of a portion of wafer 8 along cross section 1B-1B of FIG. 1A. Wafer 8 includes semiconductor substrate 10, and layer 20 forming semiconductor dies 12 and spaces 14 between semiconductor dies 12. Layer 20 includes bond pads 128 and can include, for example, one or more dielectric layers and/or one or more metallization layers. While layer 20 is depicted as a single layer and referred to herein as a "layer," it will be understood that layer 20 can include a plurality of separate layers of the same or different materials, such as metal and/or dielectric. Layer 20 can be formed during chemical vapor deposition (CVD), atomic layer deposition (ALD), thermal oxidation, sputtering, etc.

Figure 1C:
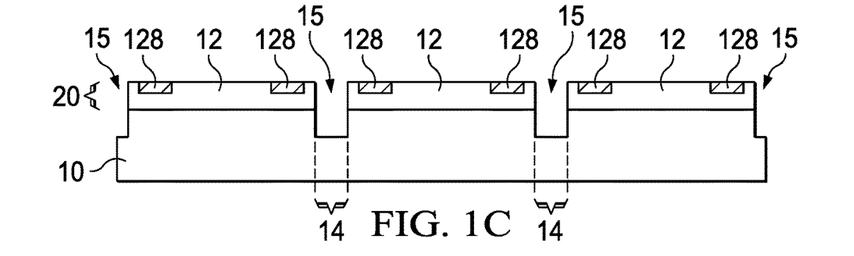

As shown in FIG. 1C, a dicing stage is performed which partially cuts into the semiconductor substrate 10 along each of the spaces 14, for example using a wide saw blade, to score the wafer and extend the groove 15 into the semiconductor wafer. Each space 14 along each row 16 and column 18 is grooved as depicted in FIG. 1C. Subsequent to this dicing stage, semiconductor wafer 8 remains intact and the interconnected semiconductor dies 12 remain attached to each other through attachment with the semiconductor substrate 10. The initial dicing stage partially removes layer 20 and a portion of substrate 10 to form grooves 15 between each interconnected semiconductor die 12. Other embodiments are also contemplated, including removing layer 20 and a portion of substrate 10 using, for example, mechanical sawing, stealth laser dicing and cool expansion, laser ablation, or wet or dry etching.

In some examples, an initial dicing stage, before a later partial saw cut, may be performed by partially removing layer 20 to form grooves 15 between each semiconductor die 12, for example through laser ablation. Laser ablation of the layer 20 can reduce damage to the portion of layer 20 which overlies the semiconductor dies 12. Laser ablation of wafer layer 20 can also remove a portion of the semiconductor substrate 10 such that grooves 15 are formed in layer 20 and the semiconductor substrate 10.

Cutting layer 20 may result in damage to the dies 12. To test for damage, an electrical test of each semiconductor die 12 can be performed, for example through the use of probe fixture. A probe tip is placed in electrical contact with one of the bond pads 128, then electrical testing is performed on each chip to confirm proper functionality. Any poorly functional or nonfunctional chip is noted for later scrap or rework subsequent to wafer dicing. This probe step can be performed in addition to a conventional probe step performed earlier in the manufacturing process prior to forming the groove. In another embodiment, this probe step after forming the groove can be the only probe step performed on the wafer, for example to reduce manufacturing time.

Figure 1D:
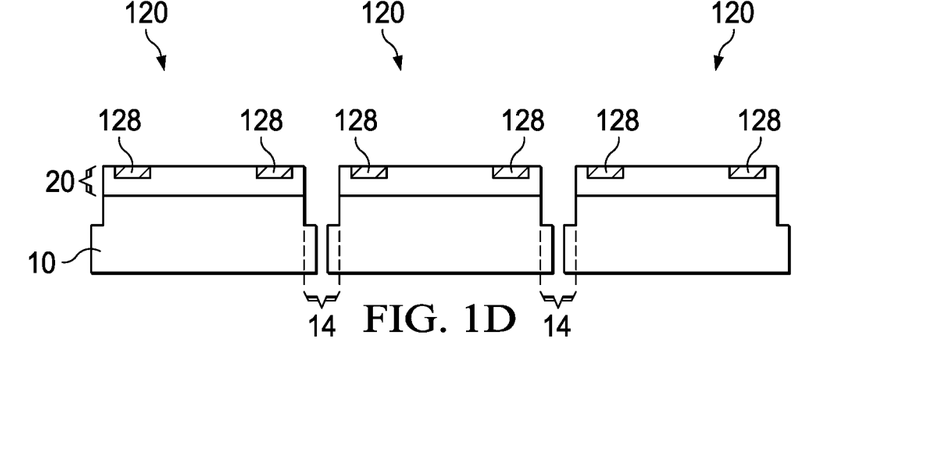
Figure 1E:
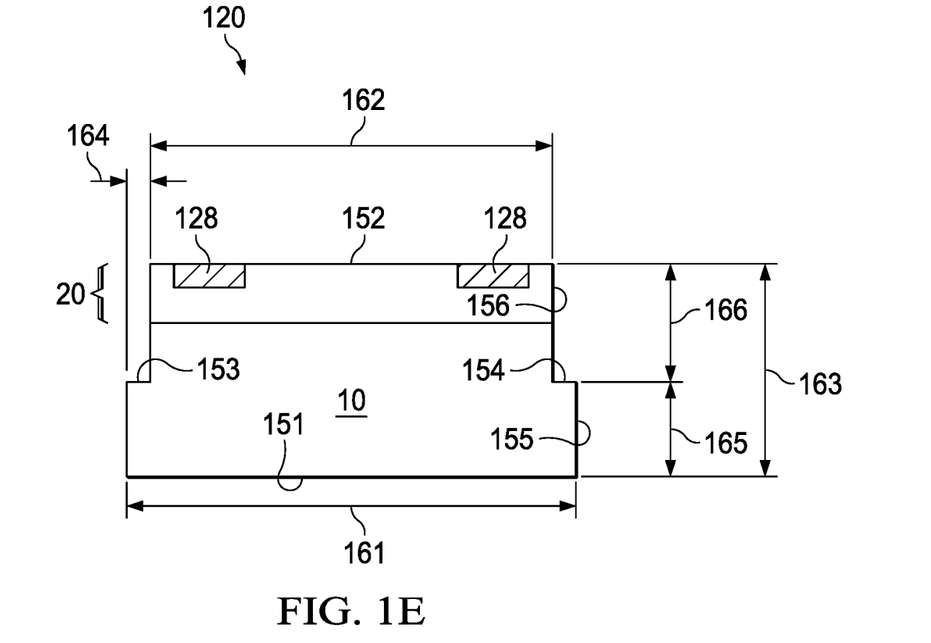

As shown in FIG. 1D, after completing the partial cut of the semiconductor substrate 10 to form the wide groove in the substrate 10, another dicing stage is performed, for example using a narrow saw blade or stealth laser dicing and cool expansion, to separate each die from an adjacent die located across one of the spaces 14. This results in the singularized (i.e. segmented, separated) dies 120 with stepped side surfaces 153 as depicted in FIG. 1E. In other examples, the narrow cut may be performed prior to the formation of the wider grooves 15. In such examples, the formation of grooves 15 after the narrow cut in inactive surface 151 would result in the singulation of the semiconductor dies 120 of wafer 8.

Due to the two-step singulation process, each singulated semiconductor die 120 includes stepped side surfaces 153 with dimensions suitable for limiting fillet height of die attach paste while mounting semiconductor die 120 to a substrate. An appropriate fillet height facilitates complete coverage of the inactive surface of the die with die attach, while leaving the active surface 152 of the die free from die attach to allow adhesion between the die and mold compound. In addition, many semiconductor package designs may specify a portion of the sides of the semiconductor die remain free from die attach to provide further adhesion between the die and mold compound.

FIG. 1E illustrates a cross section of a single singulated semiconductor die 120 with an active surface 152, an opposite inactive surface 151, and stepped side surfaces 153. While the techniques of this disclosure may be adapted to a semiconductor die of any size and thickness, the disclosed techniques may be particularly applicable to smaller dies, such as those with widths 161 less than 10 millimeters (mm) and/or thicknesses 163 less than 500 micrometers (μm). With these smaller and thin dies, controlling coverage of the inactive surface and the fillet height of die attach adhesive is more difficult than with larger dies. Stepped side surfaces 153 form edges between planar surface 156, side surface offset 154 and planar surface 155. These edges combine with the surface tension of the die attach adhesive to restrict the flow of die attach adhesive, thereby controlling fillet height. In some examples, planar surface 155 is parallel to planar surface 156, and side surface offset 154 is perpendicular to planar surface 155 and planar surface 156.

As shown in FIG. 1E, inactive surface 151 defines a width 161. In various examples, width 161 may be in a range of 0.25 mm to 20 mm. Likewise, active surface 152 defines a width 162, which is offset on each side by the offset 164 of stepped side surface 153. In various example, offset 164 may be in a range of 5 μm to 40 μm, such as 10 μm to 40 μm. While smaller offsets may provide some benefit, an offset of at least 10 μm provides a better barrier to the flow of die attach adhesive, with even great offsets providing additional restrictions to the flow of die attach adhesive. While semiconductor die 120 is not necessarily square, the width dimension ranges described herein also apply to the corresponding length dimensions of semiconductor die 120.

A 40 μm offset may be manufactured by using an 80 μm saw blade to form grooves 15 and stealth laser dicing and cool expansion to singulate dies 120 from wafer 8. Stealth laser dicing and cool expansion does not remove the material, meaning the offset 164 would be half of the width of the saw blade used to form grooves 15. Similarly, using a 52 μm saw blade to form grooves 15 and laser ablation to singulate dies 120 from wafer 8 would result in a 26 μm offset 164. In other examples, a smaller saw blade is used to singulate dies 120 from wafer 8 and offset 164 would be half the difference in thicknesses of the saw blades. For example, using an 80 μm saw blade to form grooves 15 and a 52 μm saw blade to singulate dies 120 from wafer 8 would result in a 14 μm offset 164.

A thickness 163 of semiconductor die 120 includes both the wafer substrate 10 thickness and layer 20 thickness. Stepped side surfaces 153 extend the thickness 163 of semiconductor die 120 between active surface 152 and inactive surface 151. Stepped side surfaces 153 include planar surface 155 extending from inactive surface 151 towards active surface 152, side surface offset 154, and planar surface 156 extending from active surface 152 towards inactive surface 151. Planar surface 156 is offset towards a center of the die 320 from the planar surface 155 such that the side surface offset 154 faces active surface 152. Accordingly, a surface area of active surface 152, represented in one dimension by width 162, is smaller than a surface area of inactive surface 151, represented in one dimension by width 161.

Height 165 of surface 155 is measured along thickness 163 of semiconductor die 120. Likewise, height 166 of surface 156 is measured along thickness 163 of semiconductor die 120. Heights 165, 166 are selected according to the requirements of a specific semiconductor die and package. Generally, planar surface 155 extends towards active surface 152 at least 25 percent of the distance separating active surface 152 from inactive surface 151. Similarly, planar surface 156 extends towards inactive surface 151 at least 25 percent of the distance separating active surface 152 from inactive surface 151. Accordingly, the height 165 of surface 155 is within a range of 25-75 percent of the thickness 163 of semiconductor die 120. Likewise, the height 166 of surface 156 is within a range of 25-75 percent of the thickness 163 of semiconductor die 120. Such dimensions locate side surface offset 154 at a height of 25-75 percent of the thickness 163 of semiconductor die 120. The height of side surface offset 154 limits a fillet height of die attach adhesive, although some overflow onto surface 156 is possible. Within the prescribed ranges, a greater height of surface 155 provides more room for excess die attach adhesive, allowing more die attach adhesive to be used to secure semiconductor die 120 to a substrate and improving the likelihood of full coverage of the die attach adhesive on the inactive surface 151 and a substrate. However, a greater height of surface 156 provides additional die surface area for adhesion to package mold compound. Accordingly, the heights 165, 166 may vary according to package requirements. Generally, height 165 of surface 155 will represent a greater proportion the thickness 163 with thinner semiconductor dies to allow for sufficient die attach adhesive to cover inactive surface 151. The application of die attach and mounting semiconductor dies 120 to a substrate are described in further detail with respect to semiconductor package 100.

Figure 2A:
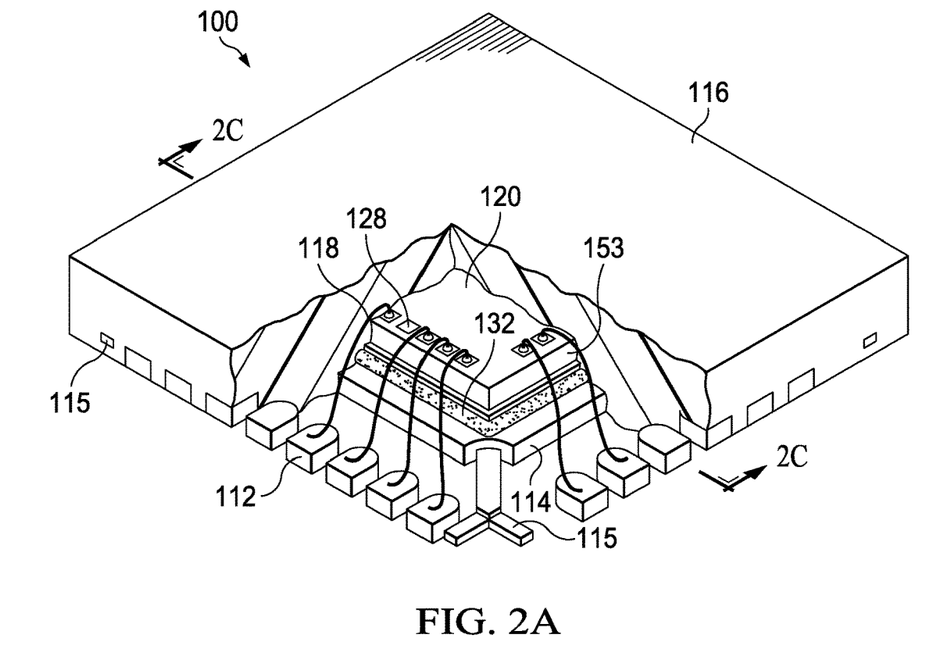
FIGS. 2A-2D illustrate a semiconductor package including a semiconductor die with stepped side surfaces, the stepped side surfaces restricting flow of die attach adhesive to control fillet height.
Figure 2B:
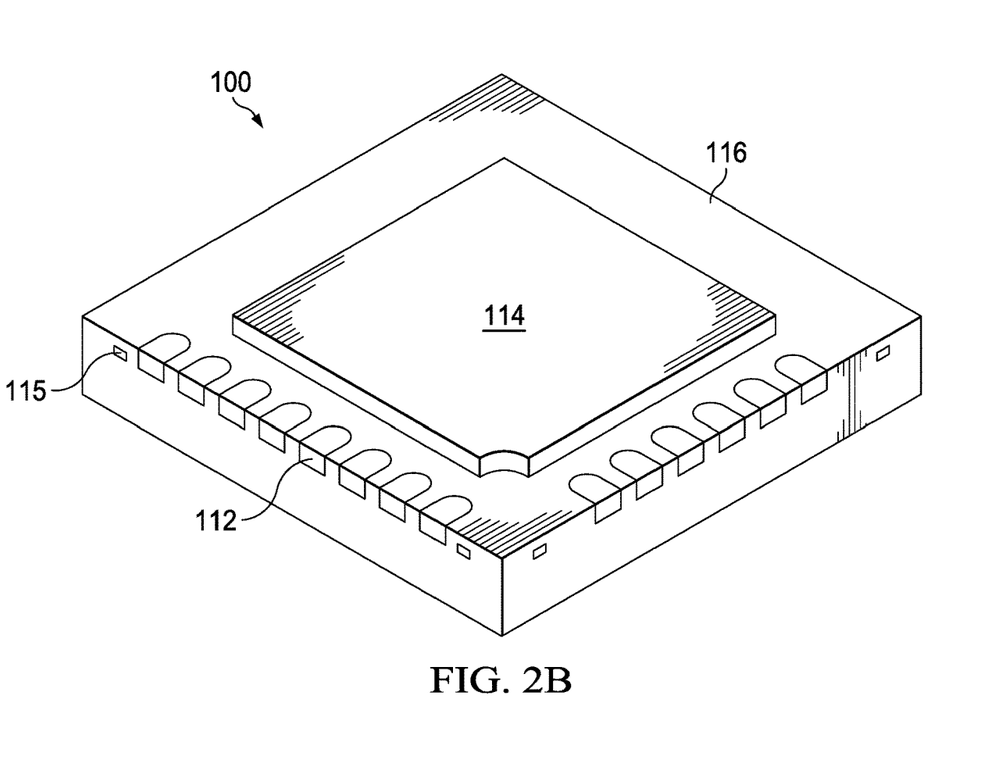
Figure 2C:
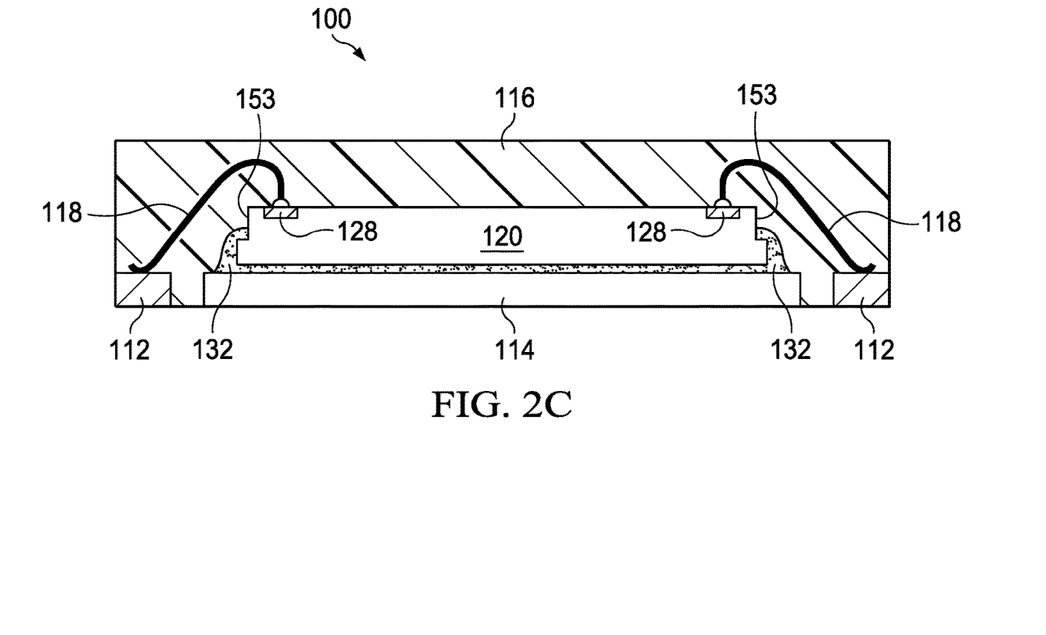
Figure 2D:
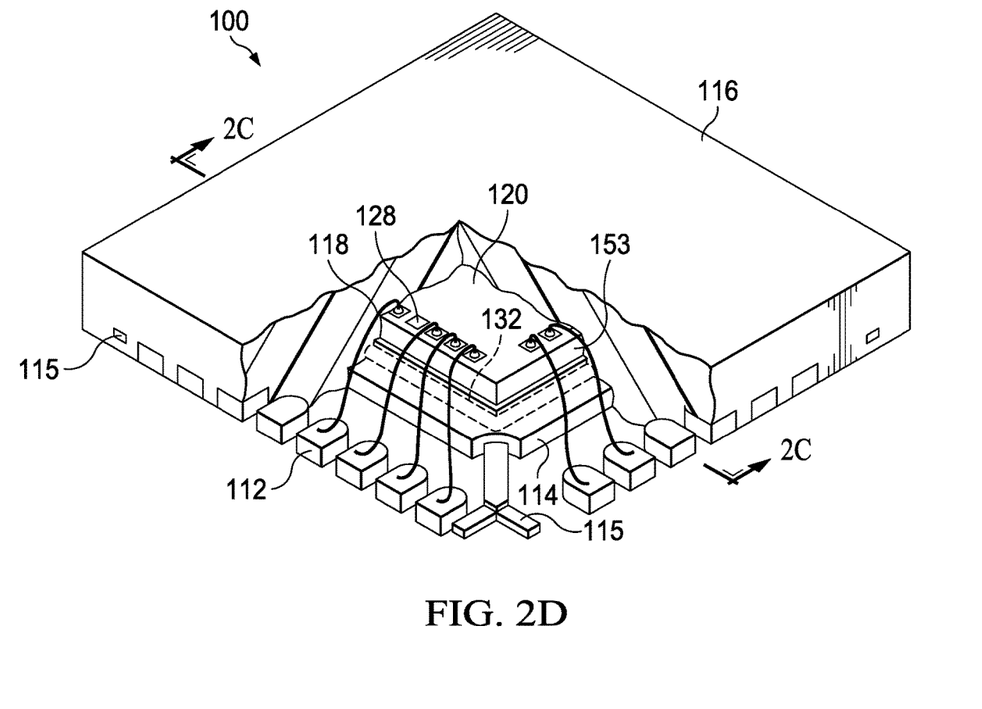

FIGS. 2A-2D illustrate a semiconductor package 100 including a semiconductor die 120 with stepped side surfaces 153. FIG. 2A is a cut-away top perspective view of semiconductor package 100, FIG. 2B is a bottom perspective view of semiconductor package 100, FIG. 2C is a sectional view of semiconductor package 100, and FIG. 2D is a cut-away top perspective view of semiconductor package 100 with die attach adhesive 132 shown in hidden lines.

Semiconductor package 100 includes a semiconductor die 120 bonded with a die attach adhesive 132 onto a metallic pad 114 of a metallic leadframe 111. Semiconductor die 120 includes a stepped side surface 153 which restrict flow and controls fillet height of die attach adhesive 132. Semiconductor package 100 further includes a mold compound 116 covering pad 114, semiconductor die 120 and at least partially covering leads 112.

In the example of semiconductor package 100, leads 112 are shaped as flat leads as used in Quad Flat No-Lead (QFN) devices or in Small Outline No-Lead (SON) devices. In other examples, leads 112 may extend beyond mold compound 116. While package is a leadless QFN package, the techniques of this disclosure may be applied to any package configuration, including leadless or leads that extend beyond mold compound 116.

Semiconductor die 120 may include any combination of semiconductor elements such as transistors and integrated circuits. In various examples of this disclosure, semiconductor die 120 may be implemented using any semiconductor material employed in industry, such as a silicon, silicon germanium, gallium arsenide, gallium nitride (GaN), such as GaN-on-silicon or GaN-on-silicon carbide, or other semiconductor material. In addition, the techniques of this disclosure may be applied to semiconductor packages with any combination of active and passive components on a leadframe in addition to semiconductor die 120.

Leadframe 111 includes pad 114 and leads 112 spaced from pad 114 by a gap. Pad 114 is a substrate providing a stable support for firmly positioning semiconductor die 120 within semiconductor package 100. Leadframe 111 further includes pad straps 115 which extend between pad 114 to an external surface of semiconductor package 100. Pad straps 115 function to support pad 114 within a leadframe strip prior to molding of mold compound 116 and singulation of semiconductor package 100 from an array of semiconductor packages manufactured on a common leadframe strip.

Bond pads 128 of semiconductor die 120 are electrically connected by wire bonds 118 to respective leads 112. Each of wire bonds 118 include a ball bond on one end to connect to a respective bond pad 128 and a stitch bond to connect to a respective lead 112. Semiconductor die 120, wire bonds 118 and pad 114 are covered by mold compound 116.

Leadframe 111, including pad 114 and leads 112, is shaped from a planar base metal of a consistent thickness. In various examples, the base metal of leadframe 111 may include copper, copper alloys, aluminum, aluminum alloys, iron-nickel alloys, or nickel-cobalt ferrous alloys. For many devices, the parallel surfaces of the flat leadframe base metal are treated to create strong affinity for adhesion to plastic compound, especially mold compounds. As an example, the surfaces of metal leadframes may be oxidized to create a metal oxide layer, such as copper oxide. Other methods include plasma treatment of the surfaces, or deposition of thin layers of other metals on the base metal surface. In some examples, the planar base metal may be plated with a plated layer enabling metal-to-metal bonding and resistant to oxidation. In an example, the plated layer may include a layer of nickel plated on the base metal and a layer of palladium plated on the nickel layer. Some of such examples, a layer of gold may be plated on the palladium layer. As an example, for copper leadframes, plated layers of tin may be used, or a layer of nickel, about 0.5 to 2.0 μm thick in some examples, followed by a layer of palladium, about 0.01 to 0.1 μm thick in the same or different examples, optionally followed by an outermost layer of gold, about 0.003 to 0.009 μm thick in the same or different examples. Such base metal and plating combinations provide resistance to corrosion, such as oxidation, at exposed portions of leadframe 111 while facilitating wire bonds between leads 112 and bond pads 128 of semiconductor die 120.

Leadframes are formed on a single sheet of metal by stamping or etching. Multiple interconnected leadframes may be formed from a single sheet of substrate, the interconnected leadframes referred to as a leadframe strip. Leadframes on the sheet can be arranged in rows and columns. Tie bars, such as pad straps 115, interconnect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate semiconductor packages, each semiconductor package including a singulated leadframe, at least one die, electrical connections between the die and leadframe (such as gold or copper wire bonds) and the mold compound which covers at least part of these structures.

Tie bars and siderails may be removed during singulation of the packages formed with a single leadframe strip. The term leadframe of represents the portions of the leadframe strip remaining within a package after singulation. With respect to semiconductor package 100, leadframe 111 includes pad 114, pad straps 115, and leads 112, although some of these elements are not interconnected following singulation of semiconductor package 100 into a discrete package.

Semiconductor die 120 is bonded on pad 114 with die attach adhesive 132. Die attach adhesive 132 covers inactive surface 151 of semiconductor die 120 and extends partially up stepped side surfaces 153. For example, at least 50 percent, such as at least 75 percent, such as at least 90 percent of the second planar surface 156 is uncovered by the die attach adhesive 132.

Adhesive 132 includes a plurality of components including a resin. The resin may include epoxy resins, polyurethane resins, and/or silicone resins. The resin may be filled or unfilled and die attach adhesive 132 may further include one or more of the following: hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower a coefficient of thermal expansion (to match die), increase thermal conductivity (e.g., metallic fillers, such as silver particles), increase elastic modulus of adhesive 132 compared to the resin base. Particulate fillers may be selected to reduce strength characteristics such as tensile strength and flexural strength compared to the resin base materials.

While semiconductor die 120 is bonded to pad 114, bond pads 128 of semiconductor die 120 are electrically connected to leads 112 with wire bonds 118. Wire bonds 118 each include a metal wire extending from a respective bond pad 128 to a respective lead 112. The metal wires of wire bonds 118, are made of electrically conductive materials, such as copper, gold, or aluminum. Each of wire bonds 118 include a ball bond by a squashed ball attached the respective bond pad 128, and a stitch bond attached to the respective lead 112.

Mold compound 116 forms an overmold that covers metallic pad 114, semiconductor die 120, wire bonds 118, as well as portions of leads 112. Mold compound 116 provides a protective outer layer for semiconductor die 120 and wire bonds 118 formed in a molding process. In some examples, mold compound 116 includes an epoxy such as an epoxy-based thermoset polymer. Reliable adhesion between the packaging compound and the covered parts supports satisfactory operation of semiconductor devices since delamination degrades the capability to keep moisture and impurities out and interferes with conductive heat dissipation.

FIGS. 3A-3D illustrate conceptual process steps for manufacturing a semiconductor package 100. FIG. 4 is a flowchart of a method of fabricating a semiconductor package with a semiconductor die with stepped side surfaces, such as such as semiconductor package 100. For clarity, the method of FIG. 4 is described with reference to semiconductor package 100 and semiconductor die 120, as well as FIGS. 1A-1E and 3A-3D; however, the described techniques may be adapted to other package designs and are not limited to the specific example of semiconductor package 100.

Steps 202 and 204 of FIG. 4 refer to singulation of semiconductor die 120 from wafer 8 as described with respect to FIGS. 1A-1E. First, as represented by FIG. 1C, grooves 15 are formed with a dicing stage by cutting through layer 20 and partially cutting into the semiconductor substrate 10 along each of the spaces 14 (FIG. 4, step 202). For example, grooves 15 may be formed with a partial saw cut. The width and profile of grooves 15 matches the profile of the saw blade; accordingly, the profile of the saw blade is reflected in side surface offsets 154 (FIG. 1E), and side surface offsets 154 may form straight, curved or irregular edges. Next, as represented by FIG. 1D, wafer 8 is cut along grooves 15 to singulate the adjacent semiconductor dies 120 (FIG. 4, step 204). During this dicing stage, less material is removed than with the cutting step to form grooves 15. Accordingly, the singulated semiconductor dies 120 each include stepped side surfaces 153 as described previously.

Figure 3A:
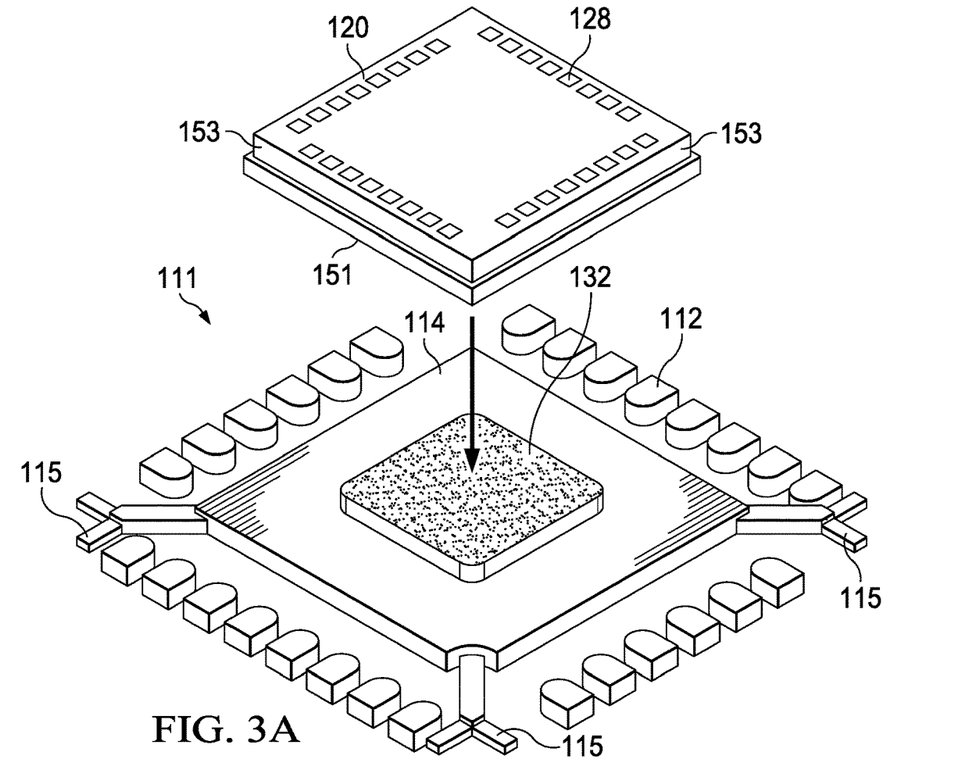
FIGS. 3A-3D illustrate conceptual process steps for manufacturing a semiconductor package a semiconductor die with stepped side surfaces, such as the semiconductor package of FIGS. 2A-2D.
Figure 4:
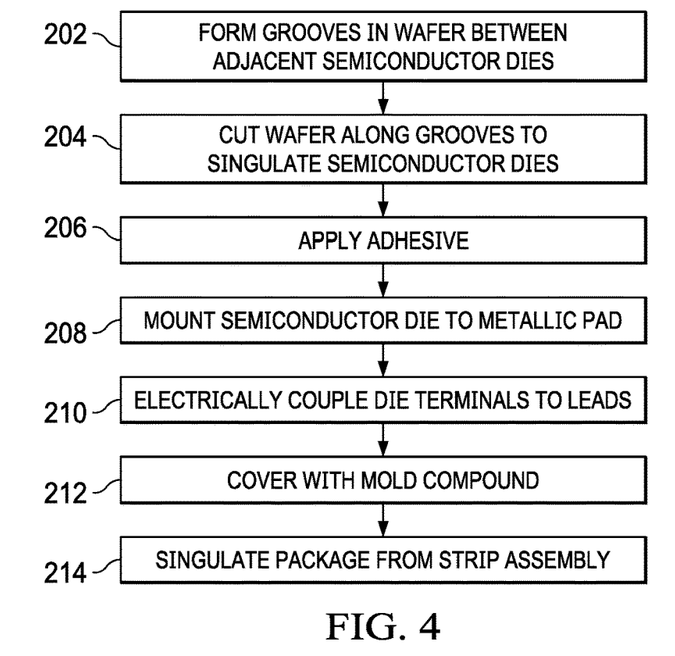
FIG. 4 is a flowchart of a method of fabricating a semiconductor package with a semiconductor die with stepped side surfaces, such as the semiconductor package of FIGS. 2A-2D.

Next, as represented by FIG. 3A, die attach adhesive 132 is applied to a surface of a metallic pad 114 of a leadframe 111 (FIG. 4, step 206). Leadframe 111 further includes leads 112. While not depicted in the figures, metallic pad 114 and leads 112 may be part of a leadframe strip including an array of interconnected leadframes. The leadframe strip may be patterned in a base metal, such as a copper. Manufacturing such a leadframe strip may include stamping or photo etching a planar base metal to form the shape of leadframe strip, including metallic pad 114 and leads 112 for each of the leadframes of the leadframe strip, as well the elements to interconnect adjacent leadframes, such as pad straps 115.

Figure 3B:
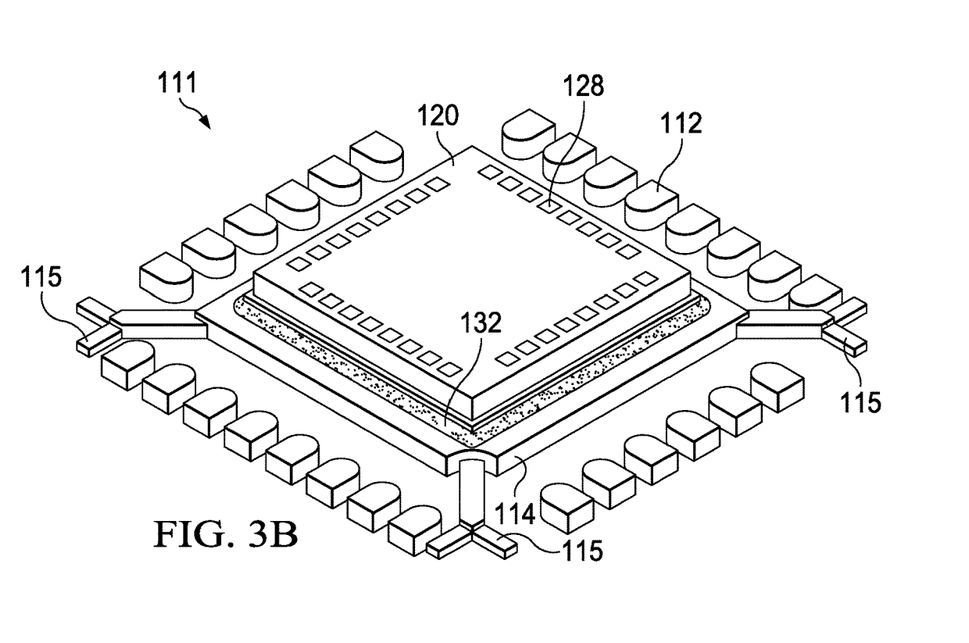

As represented by FIG. 3B, semiconductor die 120 is positioned over die attach adhesive 132 on the surface of a metallic pad 114. An imaging system may be used to locate pad 114 to assist in automated placement of die attach adhesive 132 and semiconductor die 120 on pad 114.

Semiconductor die 120 is pressed into die attach adhesive 132 such that die attach adhesive 132 covers inactive surface 151 and extends up to mount semiconductor die 120 to metallic pad 114 (FIG. 4, step 208). Excess die attach adhesive 132 is used to ensure complete coverage of inactive surface 151. The edges of stepped side surfaces 153 combine with the surface tension of die attach adhesive 132 to restrict the flow of die attach adhesive 132, thereby controlling fillet height and leaving portions of stepped side surfaces 153 free of die attach adhesive 132. After placement of semiconductor die 120 on pad 114, adhesive 132 is cured to bond semiconductor die 120 to pad 114.

Bond strength between adhesive 132 and mold compound 116 may be significantly less than bond strength between adhesive 132 and semiconductor die 120 and between mold compound 116 and semiconductor die 120. Thus, controlling contact areas between adhesive 132 and semiconductor die 120 and contact areas between mold compound 116 and semiconductor die 120 may provide desired adhesion between semiconductor die 120 and both adhesive 132 and mold compound 116. For example, the fillet height of adhesive 132 on semiconductor die 120 may be about half a thickness of semiconductor die 120. Such a configuration allows adhesive 132 to bond to the sides of semiconductor die 120 while leaving a portions of the sides of semiconductor die 120 available to bond to mold compound 116. Uncovered portions of stepped side surfaces 153 provide areas for mold compound 116 to adhere to semiconductor die 120, mitigating a risk of delamination.

Figure 3C:
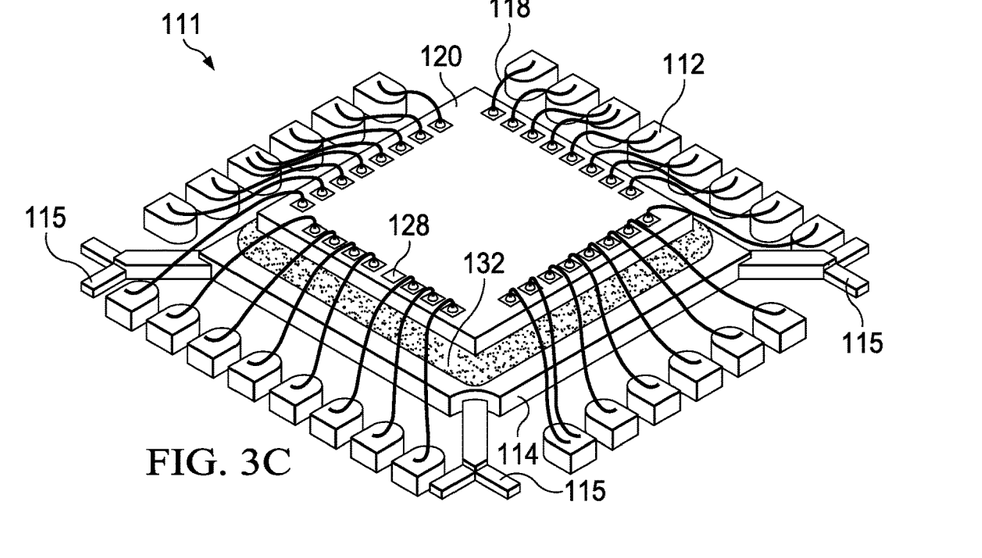

As shown in FIG. 3C, wire bonds 118 are formed between the bond pads 128 of semiconductor die 120 and leads 112 to electrically couple the die terminals, bond pads 128, to leads 112 (FIG. 4, step 210). Wire bonds 118 are formed from its bond pads 128 to adjacent leads 112 and with a wire using a capillary of a metal wire bonder. A wire bonding process may begin with positioning semiconductor die 120 on a heated pedestal to raise the temperature to between 150 and 300° C. For copper and aluminum wires, ball formation and bonding may be performed in a reducing atmosphere such as dry nitrogen gas with a few percent hydrogen gas.

With the wire bonding process, the wire is strung through the capillary of an automated bonder. A capillary is an elongated tube of an inert material such as a ceramic with a fine bore (the capillary in the strict sense) suitable for guiding a metal wire used to form the wire bonds. At the wire end extruding from the capillary tip, a free air ball may be created by melting the wire end using either a flame or a spark technique. The capillary is moved towards an attachment area of one of bond pads 128. The free air ball of melted wire is pressed against the metallization of the attachment area by a compression force, often combined with ultrasonic movement of the ball relative to the attachment area, transmitting ultrasonic energy, in order to create a ball bond, such as ball bond. The bonding process results in a metal nail head or squashed ball, such as ball bond. After the ball attachment, the capillary with the wire may be lifted to span an arch from the ball bond, such as ball bond, to an attachment area on a substrate or a leadframe, such as a lead stitch area of one of leads 112. When the wire touches the attachment area surface, the capillary tip is pressed against the wire in order to flatten it and thus to form a stitch bond, sometimes referred to as a wedge bond.

Figure 3D:
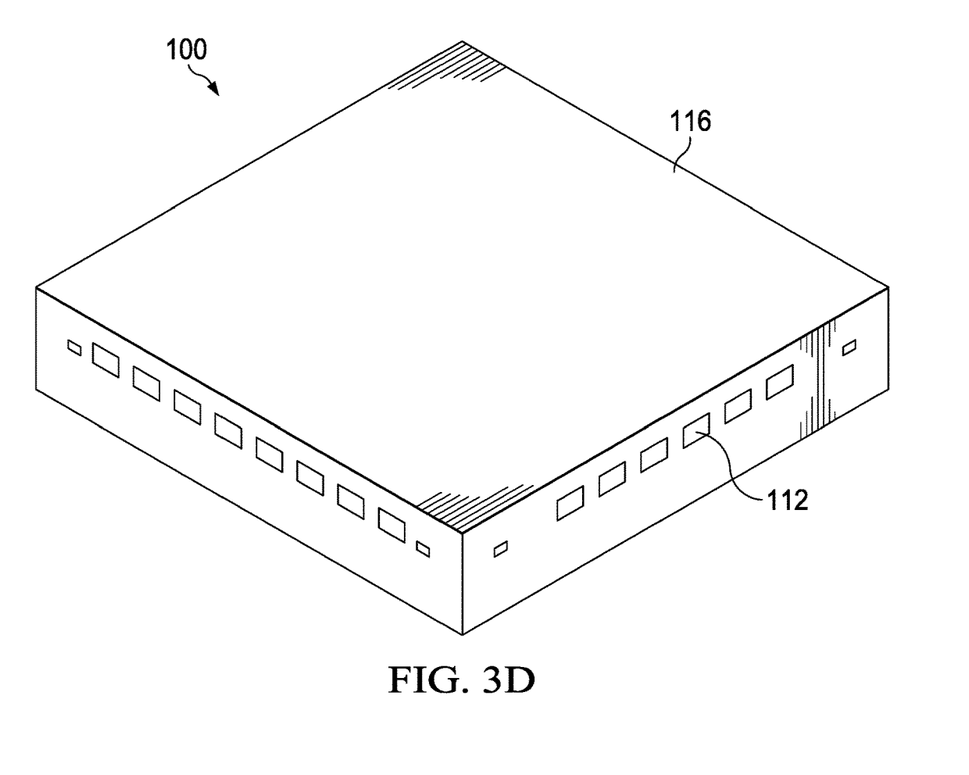

Following the formation of wire bonds 118, the assembly of the leadframe including metallic pad 114 and leads 112, semiconductor die 120, adhesive 132, and wire bonds 118 is covered in mold compound 116 (FIG. 4, step 212). Mold compound 116 is molded around the assembled semiconductor die 120 and leadframe portions. In this process, a leadframe strip including an array of leadframes 111, each with a semiconductor die 120 attached and bonded to a pad 114 is placed in the cavity of a mold, such as a steel mold. The heated and viscous mold compound, such as an epoxy resin filled with inorganic granules, is pressured into the cavity to fill the cavity and surround each semiconductor die 120 and leadframe portions without voids. Mold compound 116 covers pad 114 and at least portions of leads 112. After polymerizing the mold compound and cooling to ambient temperature, the mold is opened, while mold compound 116 remains adhering to the molded parts. All the leadframe and die assemblies of the leadframe strip may be molded in unison. Individual semiconductor packages remain interconnected as part of leadframe strip after being covered with mold compound 116.

For the finished semiconductor package 100, mold compound 116 and the assembled components are expected to retain reliable adhesion during testing and operations of semiconductor package 100 without delamination. The uncovered portions of stepped side surfaces 153 support improved adhesion to mold compound 116 to mitigate the prevalence of delamination in semiconductor package 100.

Following molding of mold compound 116, semiconductor package 100 is singulated from the array of interconnected packages manufactured on the leadframe strip (FIG. 4, step 214). For example, singulation may include cutting through a leadframe strip to separate semiconductor package 100 from a plurality of semiconductor packages 100 manufactured the leadframe strip, leaving leads 112 exposed on a surface of each package 100.

Figure 5:
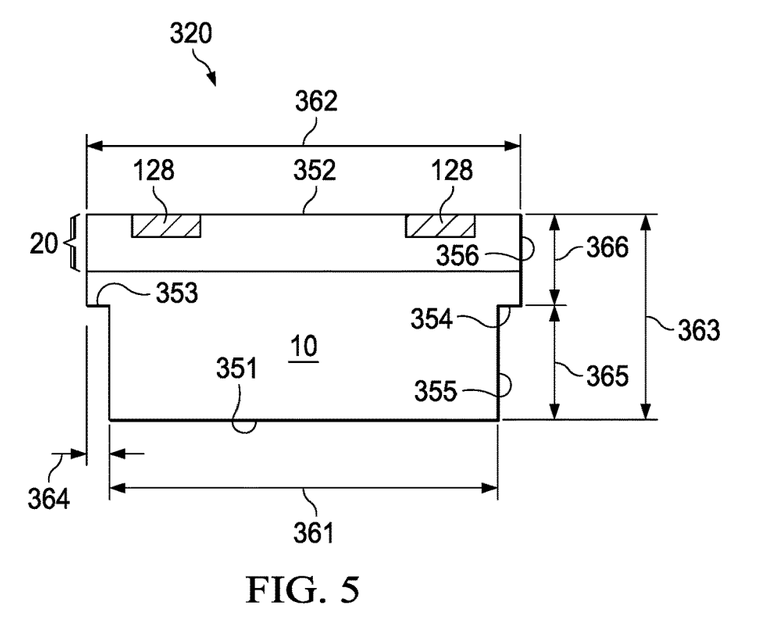
FIG. 5 is a cutaway view of an alternative semiconductor die with stepped side surfaces.

FIG. 5 illustrates a cross section of a single singulated semiconductor die 320 with an active surface 352, an inactive surface 351, and stepped side surfaces 353. The view of semiconductor die 320 illustrated in FIG. 5 corresponds to the view of semiconductor die 120 illustrated in FIG. 1E. Stepped side surfaces 353 form edges between planar surface 356, side surface offset 354 and planar surface 355. These edges combine with the surface tension of the die attach adhesive to restrict the flow of die attach adhesive, thereby controlling fillet height.

Semiconductor die 320 represents an alternative to semiconductor die 120 and may be used in place of semiconductor die 120 within package 100. Semiconductor die 320 is manufactured according to a similar process as semiconductor die 120. However, wider grooves are formed in inactive surface 351, rather than active surface 352. Accordingly, the profile of stepped side surfaces 353 are inverted compared to stepped side surfaces 153 of semiconductor die 120. Semiconductor die 320 is substantially similar to semiconductor die 120, except stepped side surfaces 353 replace stepped side surfaces 153. In all other aspects, semiconductor die 320 is the same as semiconductor die 120. For brevity, additional details included in the description of semiconductor die 120 are not repeated with respect to semiconductor die 320.

As with semiconductor die 120, due to the two-step singulation process, each singulated semiconductor die 320 includes stepped side surfaces 353 with dimensions suitable for limiting fillet height of die attach paste while mounting semiconductor die 320 to a substrate. An appropriate fillet height facilitates complete coverage of the inactive surface of the die with die attach, while leaving the active surface 352 of the die free from die attach to allow adhesion between the die and mold compound. In addition, many semiconductor package designs may specify a portion of the sides of the semiconductor die remain free from die attach to provide further adhesion between the die and mold compound.

Inactive surface 351 defines a width 361. In various examples, width 361 may be in a range of 0.25 mm to 20 mm. Likewise, active surface 352 defines a width 362, which is offset on each side by the offset 364 of stepped side surface 353. In various example, offset 364 may be in a range of 5 µm to 40 µm, such as 10 µm to 40 µm. While smaller offsets may provide some benefit, an offset of at least 10 µm provides a better barrier to the flow of die attach adhesive, with even greater offsets providing additional restrictions to the flow of die attach adhesive. While semiconductor die 320 is not necessarily square, the with dimension ranges described herein also apply to the corresponding length dimensions of semiconductor die 320.

A thickness 363 of semiconductor die 320 includes both the wafer substrate 10 thickness and layer 20 thickness. Stepped side surfaces 353 extend the thickness 363 of semiconductor die 320 between active surface 352 and inactive surface 351. Stepped side surfaces 353 include planar surface 355 extending from inactive surface 351 towards active surface 352, side surface offset 354, and planar surface 356 extending from active surface 352 towards inactive surface 351. Planar surface 355 is offset towards a center of the die 320 from the planar surface 356 such that the side surface offset 354 faces inactive surface 351. Accordingly, the surface area of inactive surface 351, represented in one dimension by width 361, is smaller than the surface area of active surface 352, represented in one dimension by width 362.

Height 365 of surface 355 is measured along thickness 363 of semiconductor die 320. Likewise, height 366 of surface 356 is measured along thickness 363 of semiconductor die 320. Heights 365, 366 are selected according to the requirements of a specific semiconductor die and package. Generally, planar surface 355 extends towards active surface 352 at least 25 percent of the distance separating active surface 352 from inactive surface 351. Similarly, planar surface 356 extends towards inactive surface 351 at least 25 percent of the distance separating active surface 352 from inactive surface 351. Accordingly, the height 365 of surface 355 is within a range of 25-75 percent of the thickness 363 of semiconductor die 320. Likewise, the height 366 of surface 356 is within a range of 25-75 percent of the thickness 363 of semiconductor die 320. Such dimensions locate side surface offset 354 at a height of 25-75 percent of the thickness 363 of semiconductor die 320. The height of side surface offset 354 limits a fillet height of die attach adhesive, although some overflow onto surface 356 is possible. Within the prescribed ranges, a greater height of surface 355 provides more room for excess die attach adhesive, allowing more die attach adhesive to be used to secure semiconductor die 320 to a substrate and improving the likelihood of full coverage of the die attach adhesive on the inactive surface 351 and a substrate. However, a greater height of surface 356 provides additional die surface area for adhesion to package mold compound. Accordingly, the heights 365, 366 may vary according to package requirements. Generally, height 365 of surface 355 will represent a greater proportion of the thickness 363 with thinner semiconductor dies to allow for sufficient die attach adhesive to cover inactive surface 351.

The specific techniques for semiconductor packages with semiconductor dies with stepped side surfaces, such as semiconductor package 100 and semiconductor dies 120, 320 are merely illustrative of the general inventive concepts included in this disclosure as defined by the following claims.

What is claimed is:

1. A semiconductor device comprising:
   a substrate;
   a semiconductor die including an active surface with bond pads, an opposite inactive surface, and stepped side surfaces extending between the active surface and the opposite inactive surface;
   wherein a surface area of the active surface is smaller than a surface area of the opposite inactive surface;
   wherein the stepped side surfaces include a first planar surface extending from the opposite inactive surface towards the active surface, a second planar surface extending from the active surface towards the opposite inactive surface, and a side surface offset between the first planar surface and the second planar surface;
   wherein the second planar surface is offset towards a center of the semiconductor die from the first planar surface such that the side surface offset faces the active surface; and
   an adhesive layer covering at least a portion of a surface area of the first planar surface and attaching the semiconductor die to the substrate.

2. The semiconductor device of claim 1, wherein the first planar surface extends towards the active surface at least 25 percent of a distance separating the active surface from the opposite inactive surface, and
   wherein the second planar surface extends towards the opposite inactive surface at least 25 percent of the distance separating the active surface from the opposite inactive surface.

3. The semiconductor device of claim 1, wherein the first planar surface is offset at least 10 micrometers (μm) from the second planar surface.

4. The semiconductor device of claim 1, wherein the first planar surface is offset at from 10 to 40 μm from the second planar surface.

5. The semiconductor device of claim 1,
wherein a surface area of the opposite inactive surface is smaller than a surface area of the active surface, and
wherein the second planar surface is offset away from a center of the semiconductor die from the first planar surface such that the side surface offset faces the opposite inactive surface.

6. The semiconductor device of claim 1,
wherein first planar surface is parallel to the second planar surface, and
wherein the side surface offset is perpendicular to the first planar surface and the second planar surface.

7. The semiconductor device of claim 1, wherein the adhesive layer is a die attach paste.

8. The semiconductor device of claim 7, wherein the die attach paste includes silver particles.

9. The semiconductor device of claim 1,
wherein the adhesive layer forms a fillet covering at least 75 percent of the first planar surface, and
wherein at least 75 percent of the second planar surface is free of the adhesive layer.

10. The semiconductor device of claim 1, wherein the stepped side surfaces are configured to limit coverage of the stepped side surfaces with the adhesive layer.

11. The semiconductor device of claim 1, wherein the adhesive layer is adjacent to at least a portion of the side surface offset.

12. The semiconductor device of claim 1, wherein the substrate is a metallic pad.

13. The semiconductor device of claim 12, further comprising leads spaced from the metallic pad by a gap.

14. The semiconductor device of claim 13, further comprising wire bonds extending between the bond pads of the semiconductor die and the leads.

15. The semiconductor device of claim 1, further comprising mold compound covering the semiconductor die, the adhesive layer, and at least partially covering the substrate.

16. The semiconductor device of claim 1, wherein the adhesive layer covers all of the surface area of the first planar surface.

17. The semiconductor device of claim 16 wherein the adhesive layer further covers a portion, but not all, of the first planar surface.

18. A semiconductor die comprising:
an active surface with bond pads;
an opposite inactive surface;
stepped side surfaces extending between the active surface and the opposite inactive surface;
wherein the stepped side surfaces include a first planar surface extending from the opposite inactive surface towards the active surface, a second planar surface extending from the active surface towards the opposite inactive surface, and a side surface offset between the first planar surface and the second planar surface;
wherein a surface area of the active surface is smaller than a surface area of the opposite inactive surface; and
wherein the second planar surface is offset towards a center of the die from the first planar surface such that the side surface offset faces the active surface.

19. The semiconductor die of claim 18,
wherein the first planar surface extends towards the active surface at least 25 percent of a distance separating the active surface from the opposite inactive surface, and
wherein the second planar surface extends towards the opposite inactive surface at least 25 percent of the distance separating the active surface from the opposite inactive surface.

20. The semiconductor die of claim 18, wherein the first planar surface is offset at least 10 micrometers (μm) from the second planar surface.

21. The semiconductor die of claim 18, wherein an adhesive layer covers all of the surface area of the first planar surface.

22. The semiconductor die of claim 21 wherein the adhesive layer further covers a portion, but not all, of the first planar surface.

* * * * *